United States Patent [19]

Mesuda et al.

[11] Patent Number: 5,563,921

[45] Date of Patent: Oct. 8, 1996

[54] JITTER DETECTION APPARATUS USING DOUBLE-PLL STRUCTURE

[75] Inventors: Etsuji Mesuda, Atsugi; Kazuhiko Ishibe, Samukawa-machi, both of Japan

[73] Assignee: Anritsu Corporation, Tokyo, Japan

[21] Appl. No.: 490,474

[22] Filed: Jun. 14, 1995

[30]     Foreign Application Priority Data

Jun. 24, 1994  [JP]  Japan .................................. 6-166307

[51] Int. Cl.⁶ ...................................................... H03D 3/24
[52] U.S. Cl. .............................. 375/376; 327/156; 331/11
[58] Field of Search ............................... 331/16, 11, 1 R, 331/25, 1 A; 375/376, 375, 371, 373, 327; 327/156, 159

[56]                  References Cited

U.S. PATENT DOCUMENTS

| | | | |
|---|---|---|---|
| 4,158,857 | 6/1979 | Hiraguri | 358/139 |
| 4,225,828 | 9/1980 | Watanabe et al. | 331/1 A |
| 4,412,299 | 10/1983 | Huffman | 364/570 |
| 5,146,186 | 9/1992 | Vella | 331/18 |
| 5,254,955 | 10/1993 | Saeki et al. | 328/155 |
| 5,259,007 | 11/1993 | Yamamoto | 375/120 |

OTHER PUBLICATIONS

"Error Rate Jitter Measuring Equipment ME520A/B"; Anritsu Technical, No. 52 Sep. 1986; pp. 40–50.

"Sony CXB1112Q" Phase Frequency Detector with Differential I/O; pp. 5–30 – 5–31.

*Primary Examiner*—Stephen Chin
*Assistant Examiner*—Don Vo
*Attorney, Agent, or Firm*—Frishauf, Holtz, Goodman, Langer & Chick

[57]                    ABSTRACT

A target signal input to a mixer circuit of a frequency converter is frequency-converted to have a low frequency by a signal obtained by frequency-multiplying an output signal from the voltage-controlled crystal oscillator by M. The frequency-converted output is compared with the output signal from the voltage-controlled crystal oscillator by a phase/frequency comparator. A loop filter receives an error signal based on the phase/frequency comparison and performs loop control to lock the phase of the output signal from the voltage-controlled crystal oscillator to the phase of the output signal from the frequency converter. The jitter component of the target signal exhibiting phase variations at a frequency higher than a loop band contained in the error signal is output from a jitter detection filter before the loop filter via a branching circuit. Even if the target signal having a high frequency undergoes a great frequency change, stable, accurate jitter measurements can be performed following the change.

26 Claims, 7 Drawing Sheets

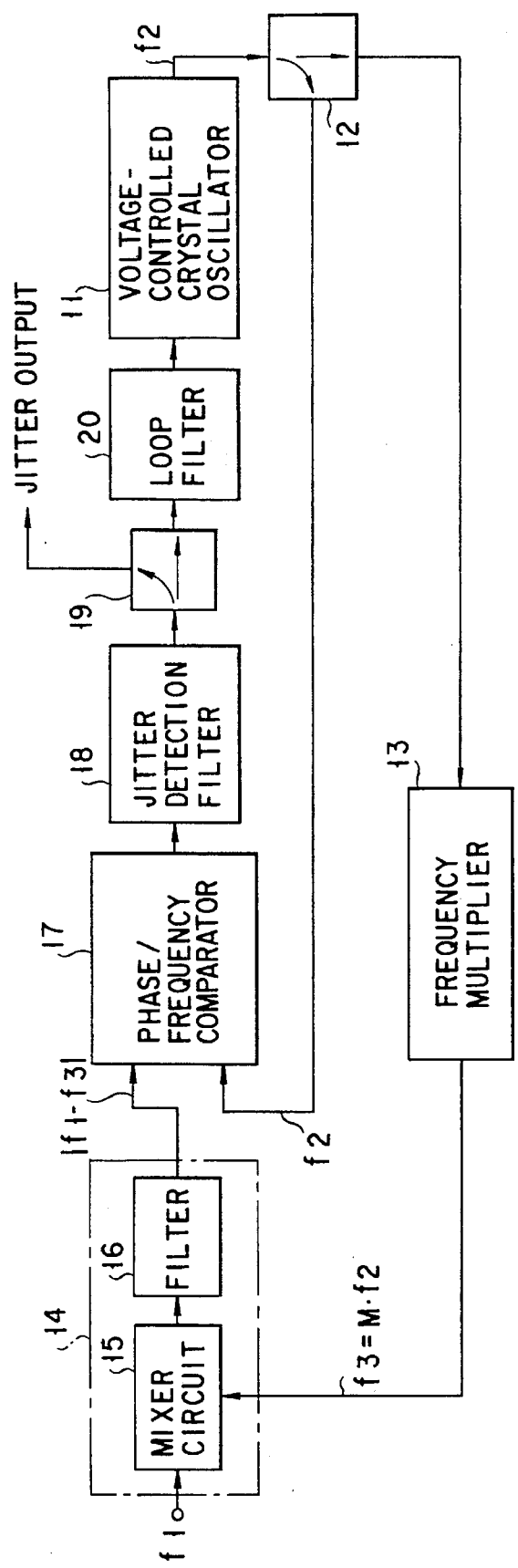
F I G. 1

F I G. 4A 
F I G. 4B 
F I G. 4C 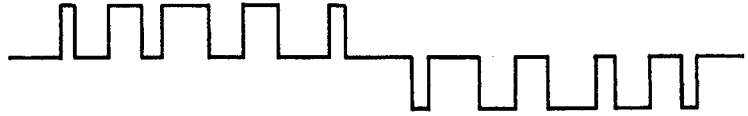
F I G. 4D 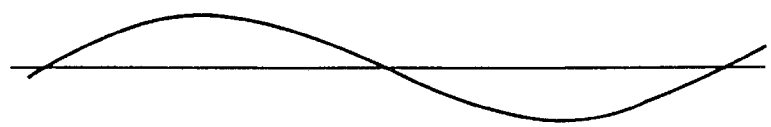
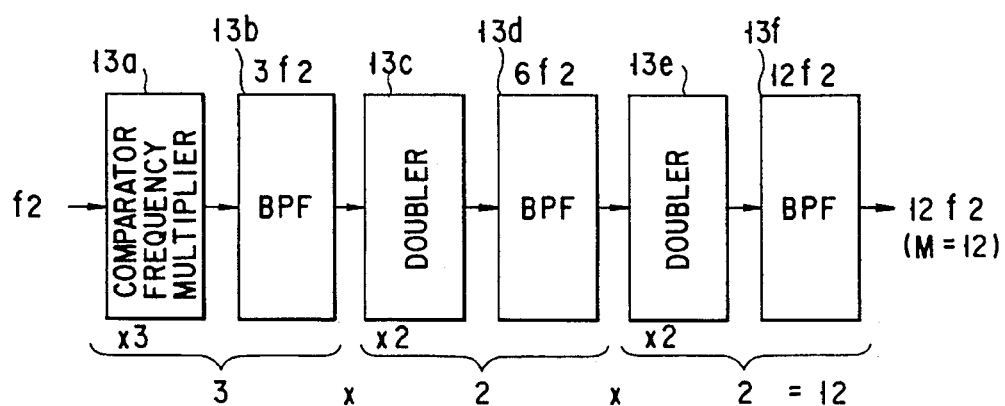
F I G. 6

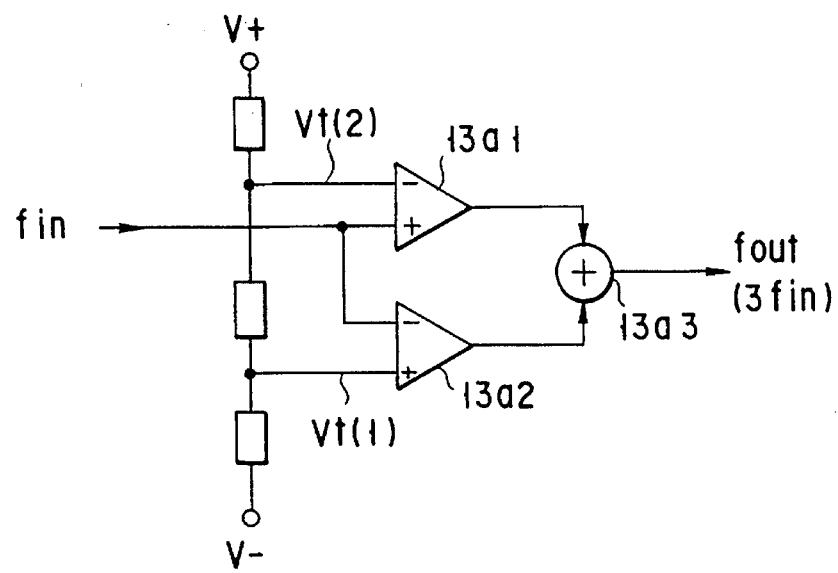
F I G. 7A
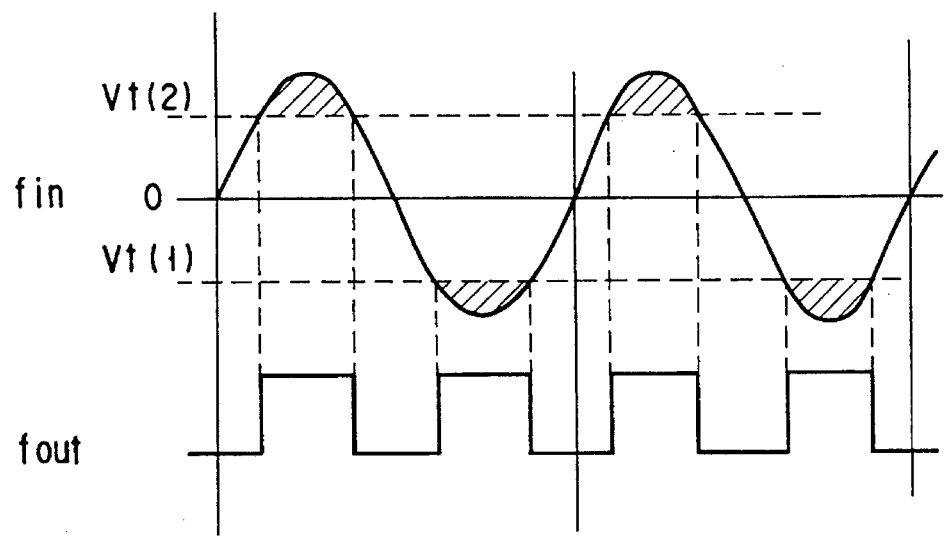
F I G. 7B

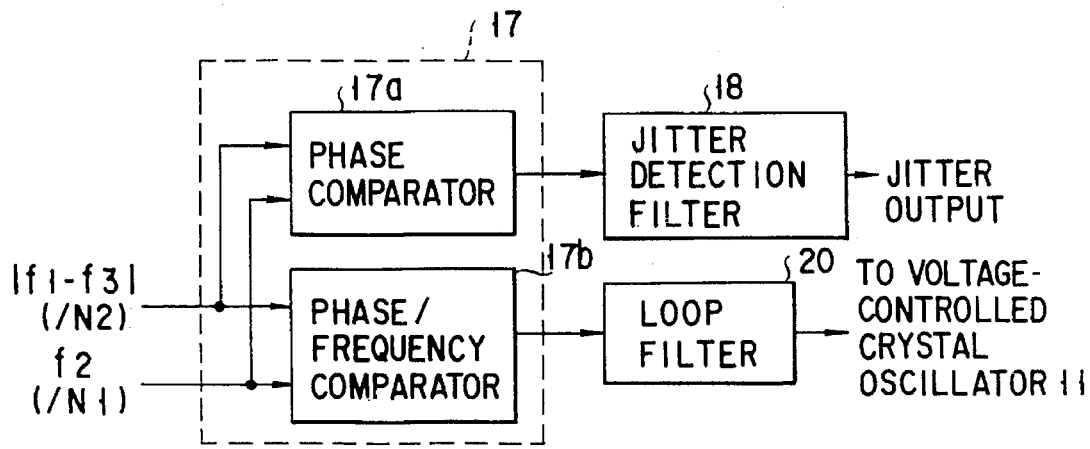
F I G. 8
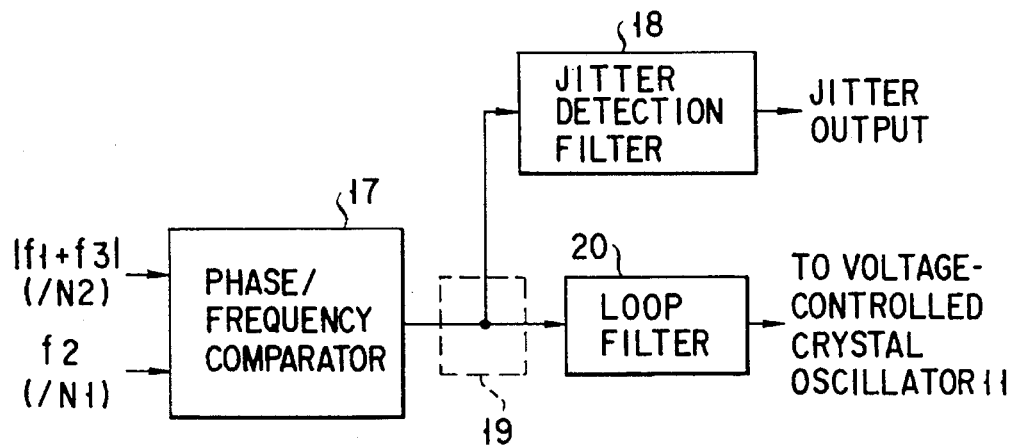
F I G. 9

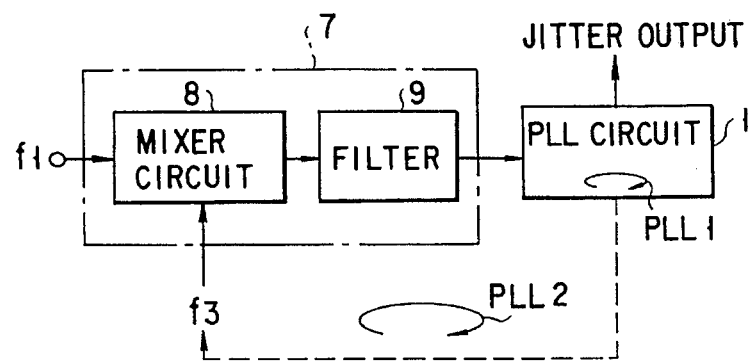
F I G. 12

JITTER DETECTION APPARATUS USING DOUBLE-PLL STRUCTURE

BACKGROUND OF THE INVENTION

1. Field of the Invention

The present invention generally relates to a jitter detection apparatus and, more particularly, to a jitter detection apparatus for detecting a jitter component contained in a signal used in a communication system or the like, i.e., a phase variation component.

2. Description of the Related Art

Recently, communication systems as infra-structures for supporting information-oriented societies have assumed greater importance for the next generation. ITU-T (CCITT in the past) has recommended a new synchronous network interface termed a synchronous digital hierarchy (SDH) system as a trunk network for a communication system. Apparatuses to be incorporated in such an SDH system have been developed by PTTs and communication equipment manufacturers in all the countries of the world, and are being put into practice.

In measurement in such an SDH apparatus and system, one of the important factors to be considered is jitter defined as instantaneous fluctuations in the time position of a signal with respect to an ideal time position due to crosstalk or reflection in a digital line.

In order to manage jitter contained in a signal used in an SDH system, ITU-T[2] recommended one of the specifications required for jitter up to a bit rate of STM-16 (2488.32 Mb/s). That is, it specifies that output allowable jitter (Output Jitter, Jitter Generation) must not exceed a specified value in a predetermined jitter frequency band. As a unit of measurement, UI (Unit Interval) is used.

Conventionally, as is known, a jitter detect detection apparatus having a PLL (phase-locked loop) circuit 1 shown in FIG. 10 is used to detect a jitter component contained in a signal used in the above communication system.

The jitter detection apparatus shown in FIG. 10 is equivalent to a PLL structure for jitter measurement, which is disclosed, e.g., "Error Rate.Jitter Measuring Equipment ME520A/B": ANRITSU TECHNICAL 52, pp. 46–50, (especially FIG. 22 of page 46), September 1986.

As shown in FIG. 10, a target signal (to be measured) having a frequency f1, which is input as a jitter detection target, and a signal (reference signal) having a frequency f2 (near the frequency f1) and containing a very small amount of residual jitter component, which is output from a voltage-controlled crystal oscillator (VCXO) 2, are input to a phase/frequency comparator (PFD) 3. The phase/frequency comparator 3 outputs an error signal corresponding to the frequency and phase differences between the two input signals. A component having a frequency higher than the frequency of the signal input to the phase/frequency comparator 3 is removed from the error signal by a jitter detection filter 4. With this operation, a signal containing a jitter component contained in the target signal is extracted as a jitter output. The signal is then input to a low-pass loop filter 5 having a cutoff frequency lower than the frequency of the Jitter component of the target signal. Thereafter, an output signal from the voltage-controlled crystal oscillator 2 is locked to the target signal by a control voltage detected by the loop filter 5.

In the jitter detection apparatus having such a PLL circuit structure, when jitter occurs in a target signal while an output signal from the voltage-controlled crystal oscillator 2 is locked to the target signal, a jitter component contained in the target signal is output from the Jitter detection filter 4, with the output removed from the error signal by a jitter detection filter 4. With this operation, a signal containing a jitter component contained in the target signal is extracted as a jitter output. The signal is then input to a low-pass loop filter 5 having a cutoff frequency lower than the frequency of the Jitter component of the target signal. Thereafter, an output signal from the voltage-controlled crystal oscillator 2 is locked to the target signal by a control voltage detected by the loop filter 5.

In the jitter detection apparatus having such a PLL circuit structure, when jitter occurs in a target signal while an output signal from the voltage-controlled crystal oscillator 2 is locked to the target signal, a jitter component contained in the target signal is output from the Jitter detection filter 4, with the output signal from the voltage-controlled crystal oscillator 2 serving as a reference signal.

Phase variations (jitter) in a target signal can be confirmed by displaying an output from the jitter detection filter 4, indicating it with a meter, or recording it.

The jitter detection apparatus having the above PLL circuit 1 is effective up to a target signal frequency of several 100 MHz. However, accurate detection of jitter in a target signal having a higher frequency (e.g., several GHz) demands a voltage-controlled crystal oscillator and a phase/frequency comparator which exhibit both high stability in such a high frequency band and good linearity. Such an arrangement is difficult to realize in practice. Even if this arrangement can be realized, the overall cost of the apparatus becomes very high.

As a technique for solving this problem, the following technique has been known.

As shown in FIG. 11, in this technique, a target signal is frequency-divided by N using a frequency divider 6, and the resultant signal is input to a PLL circuit 1. An output signal from a voltage-controlled crystal oscillator 2 in the PLL circuit 1 is then locked to this frequency-divided signal.

In the above technique of locking an output signal from the voltage-controlled crystal oscillator to a signal obtained by frequency-dividing a target signal using the frequency divider, the phase modulation degree of the frequency-divided output is smaller than that of the target signal by the degree of frequency division, resulting in a deterioration in jitter detection sensitivity.

For example, if the initial phase of a target signal is ignored, a target signal which is phase-modulated with a sinusoidal wave can be given by $$Ea = A \cos\{\omega_1 t + \beta \cos(\omega_m t)\}$$

where $\omega_1$ is the angular frequency of a carrier wave, $\omega_m$ is the angular frequency of a modulated wave, and $\beta$ is the modulation degree. In contrast to this, when this target signal is frequency-divided by N, the resultant output signal is given by $$Eb = B \cos\{(\omega_1 t/N) + (\beta/N) \cos(\omega_m t)\}$$

That is, the frequency of the carrier wave decreases to 1/N, and the modulation degree also decreases to $\beta/N$. Therefore, when the phase-modulated wave of this signal is detected, the output level is lower than that of the phase-modulated wave of the target signal corresponding to the frequency division ratio.

SUMMARY OF THE INVENTION

It is, therefore, an object of the present invention to provide a new and improved jitter detection apparatus which solves the above problem of the prior art, can detect the jitter component of a target signal in a high-frequency band with high sensitivity and high precision, and can broaden the measurable frequency range of a target signal beyond the variable width of the frequency of a voltage-controlled crystal oscillator.

According to a first aspect of the present invention, there is provided a jitter detection apparatus comprising:

a voltage-controlled crystal oscillator;

a frequency multiplier for receiving an output signal from the voltage-controlled crystal oscillator, multiplying a frequency of the output signal, and outputting the resultant signal;

a frequency converter for frequency-mixing a target signal as a jitter detection target and the output signal from the frequency multiplier, and outputting a signal having a frequency corresponding to a frequency difference between the two signals;

a comparator for outputting an error signal corresponding to a phase difference between the output signal from the frequency converter and the output signal from the voltage-controlled crystal oscillator;

a loop filter for controlling a phase of the output signal from the voltage-controlled crystal oscillator by using the error signal output from the comparator; and a low-pass jitter detection filter for filtering the error signal from the comparator and outputting a jitter component of the target signal.

According to a second aspect of the present invention, there is provided a jitter detection apparatus for detecting a jitter component contained in a target signal having a first frequency f1, comprising:

a voltage-controlled crystal oscillator for outputting an output signal having a second frequency f2;

a first branching circuit for branching the output signal from the voltage-controlled crystal oscillator;

a frequency multiplier for multiplying the frequency f2 of one signal, branched by the first branching circuit, by M to obtain and output an output signal having a third frequency f3 (=M·f2);

a mixer circuit for mixing the target signal with the output signal from the frequency multiplier;

filter means for outputting an output signal which has a frequency component, corresponding to a difference |f1−f3| between the first and third frequencies, of output signal components from the mixer circuit;

phase/frequency comparison means for receiving the output signal from the filter means and the other signal branched by the branching circuit, comparing frequencies and phases of the signals, and outputting an error signal;

a jitter detection filter for detecting a jitter component contained in the target signal by filtering the error signal output from the phase/frequency comparison means with predetermined frequency characteristics;

a second branching circuit for branching the output signal from the jitter detection filter into first and second signals, and outputting the first signal as a jitter component contained in the target signal; and a loop filter for outputting a control signal for controlling a phase of the output signal from the voltage-controlled crystal oscillator by filtering the second signal branched by the second branching circuit with predetermined frequency characteristics.

According to a third aspect of the present invention, there is provided a jitter detection apparatus for detecting a jitter component contained in a target signal having a first frequency f1, comprising:

a voltage-controlled crystal oscillator for outputting an output signal having a second frequency f2;

a first branching circuit for branching the output signal from the voltage-controlled crystal oscillator;

a frequency multiplier for multiplying the frequency f2 of one signal, branched by the first branching circuit, by M to obtain and output an output signal having a third frequency f3 (=M·f2);

a mixer circuit for mixing the target signal with the output signal from the frequency multiplier;

filter means for outputting an output signal which has a frequency component, corresponding to a difference |f1−f3| between the first and third frequencies, of output signal components from the mixer circuit;

a first frequency divider for dividing by N1 the frequency f2 of the other signal branched by the first branching circuit;

a second frequency divider for frequency-dividing the output signal output from the filter means having a frequency component |f1−f3|;

phase/frequency comparison means for receiving the output signals frequency-divided by the first and second frequency dividers and comparing frequencies and phases of the output signals to output an error signal;

a jitter detection filter for detecting a jitter component contained in the target signal by filtering the error signal output from the phase/frequency comparison means with predetermined frequency characteristics;

a second branching circuit for branching the output signal from the jitter detection filter into first and second signals, and outputting the first signal as a jitter component contained in the target signal; and a loop filter for outputting a control signal for controlling a phase of the output signal from the voltage-controlled crystal oscillator by filtering the second signal branched by the second branching circuit with predetermined frequency characteristics.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a block diagram showing the arrangement of an embodiment of the present invention;

FIGS. 4A to 4D are timing charts for explaining the operation of the main part of the arrangement shown in FIG. 1;

FIG. 6 is a block diagram showing a practical arrangement of the frequency multiplier shown in FIG. 5, which is used to realize a 12 frequency multiplier;

FIGS. 7A and 7B are a circuit diagram showing the arrangement of a comparator/frequency multiplier used in the arrangement shown in FIG. 6, and a timing chart for explaining the operation of the comparator/frequency multiplier;

FIG. 8 is a block diagram showing the main part of still another embodiment of the present invention;

FIG. 9 is a block diagram showing the main part of still another embodiment of the present invention;

FIG. 12 is a block diagram showing an arrangement based on the basic technique of the present invention.

DETAILED DESCRIPTION OF THE PREFERRED EMBODIMENTS

Figure 2:
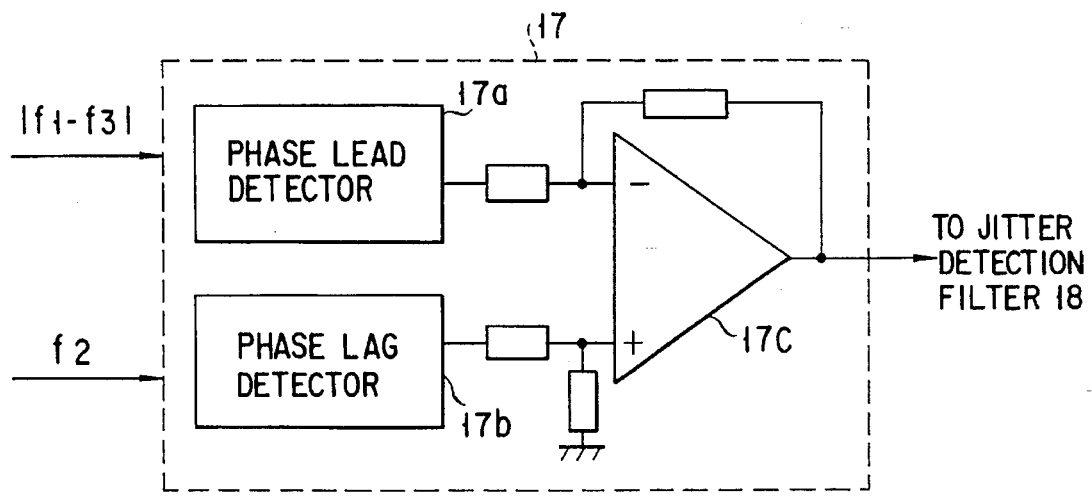
FIG. 2 is a block diagram showing a practical arrangement of the phase/frequency comparator shown in FIG. 1.

Reference will now be made in detail to the presently preferred embodiments of the invention as illustrated in the accompanying drawings, in which like reference characters designate like or corresponding parts throughout the several drawings.

The basic technique of the present invention will be described first.

In this basic technique, as shown in FIG. 12, a target signal and a reference signal having a frequency f3 are frequency-mixed by a mixer circuit 8 of a frequency converter 7, and a filter 9 detects only a signal component having a frequency corresponding to the difference between the two signals from the mixed output. This signal component is input to a PLL circuit 1. An output signal from a voltage-controlled crystal oscillator 2 is then locked to the signal which has been converted by the frequency converter 7 to have a low frequency.

If a target signal is input to a phase/frequency comparator 17 after the frequency of the target signal is converted into a low frequency by frequency division or frequency mixing, an inexpensive voltage-controlled crystal oscillator and an inexpensive phase/frequency comparator for a low frequency band can be used.

In addition, in this basic technique, providing that the residual jitter in a reference signal having a frequency f3 is very small, a difference signal component obtained by frequency-converting a target signal Ea with the reference signal having the frequency f3 is given as follows:

$$Ec = C \cos\{(\omega_1 - \omega_3)t + \beta \cos(\omega_m t)\}$$

where $\omega_3$ is the angular frequency of a carrier wave having the frequency f3. That is, the phase modulation degree of the converted output is the same as that of the target signal, and no deterioration in jitter detection sensitivity occurs.

However, with the basic technique based on frequency conversion in the mixer circuit 8 alone, the change range of the frequency of a target signal is limited by the variable width of the frequency of the voltage-controlled crystal oscillator which determines the lock range of the PLL circuit 1 in FIG. 9.

Figure 10:
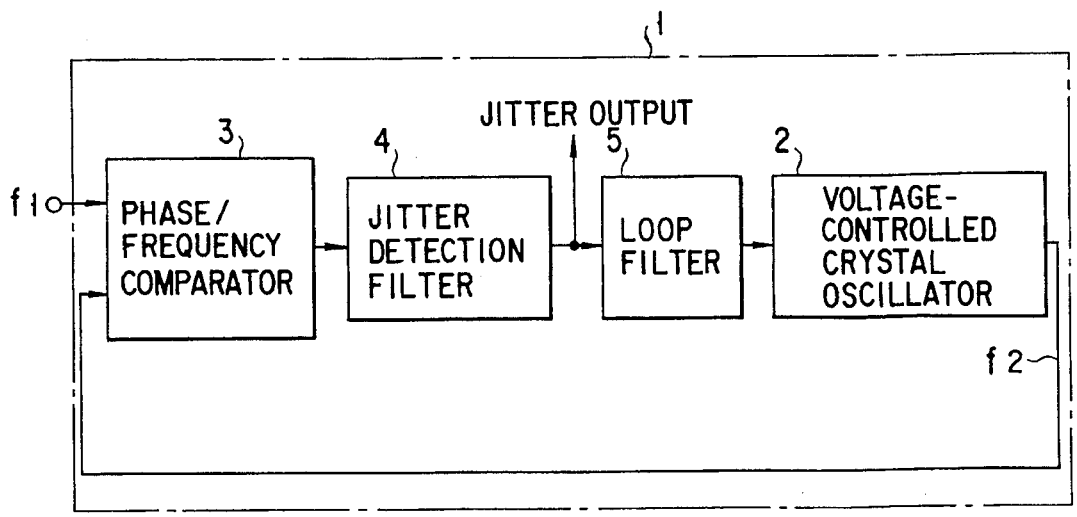
FIG. 10 is a block diagram showing the arrangement of a conventional apparatus.
Figure 11:
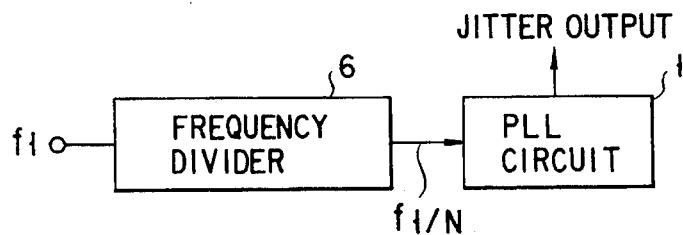
FIG. 11 is a block diagram showing the arrangement of another conventional apparatus.

That is, the voltage-controlled crystal oscillator in the PLL circuit 1 in FIG. 10 can reliably change the frequency only within the range of about ±0.01% of the oscillation frequency. For example, the variable width of the frequency of a 100-MHz voltage-controlled crystal oscillator is about ±10 kHz. Therefore, with respect to a change in the frequency of a target signal in a frequency band (several GHz) much higher than this oscillation frequency, phase locking can be performed only with a width of ±10 kHz, thus greatly limiting the allowable change range of the frequency of the target signal.

It is generally difficult to obtain a reference signal, as the reference signal having the frequency f3 in FIG. 12, which contains a small amount of residual jitter in a high frequency band. Since the residual jitter passes through the mixer circuit 8 to be detected as a jitter component, accurate jitter detection cannot be performed.

In the present invention, therefore, in order to improve the basic technique described above, a circuit arrangement which is constituted by a mixer and two PLLs (PLL 1 and PLL 2) to perform PLL processing for even the reference signal having the frequency f3 is employed in addition to frequency conversion in the mixer circuit, as indicated by the broken line in FIG. 12.

Embodiments of the present invention will be described below with reference to the accompanying drawings.

FIG. 1 shows the arrangement of a jitter detection apparatus according to an embodiment.

Referring to FIG. 1, a voltage-controlled crystal oscillator 11 is designed to continuously change the oscillation frequency of a crystal oscillation circuit almost in proportion to the control voltage. A frequency f2 of an output signal from this voltage-controlled crystal oscillator 11 is set to be near 1/(M−1) or 1/(M+1) (M is an integer of two or more, e.g., 12) a frequency f1 of a target signal. As described above, the variable width of the frequency f2 (e.g., several 100 MHz) is about ±0.01% of the oscillation frequency.

An output signal from the voltage-controlled crystal oscillator 11 is branched by a first branching circuit 12. One branch output is input to a frequency multiplier 13.

The frequency multiplier 13 frequency-multiplies a signal from the first branching circuit 12 by M, and outputs the resultant signal. The frequency multiplier 13 may use any of the following frequency multiplication methods: a method of obtaining a signal having an M-fold frequency by using a multi-stage arrangement constituted by a doubler and a frequency multiplier based on a comparator; a method of outputting a signal having an M-fold frequency which is locked to an input signal by a PLL circuit; and a method of distorting an input signal with an SRD (step recovery diode), and extracting only an Mth-degree (M·f2) component of the resultant harmonic components with a filter or the like. However, a doubler is preferably used to reduce phase fluctuations of an input/output signal.

An output signal (frequency f3) from the frequency multiplier 13 is input to a mixer circuit 15 of a frequency converter 14, together with a target signal, so as to be frequency-mixed. The frequency converter 14 causes a filter 16 to output only a signal component having a frequency f1−f3 or f3−f1, which corresponds to the frequency difference between the two input signals, of the signal components output from the mixer circuit 15, thereby frequency-converting the target signal into a signal having a lower frequency. Note that since the frequency f3 of the output signal from the frequency multiplier 13 is equal to M·f2, and the frequency f2 is near 1/(M−1) or 1/(M+1) the frequency f1, a signal having a frequency near the frequency f2 is output from the frequency converter 14.

The output signal from the frequency converter 14 and the other branch output from the first branching circuit 12 are input to the phase/frequency comparator 17.

Figure 3:
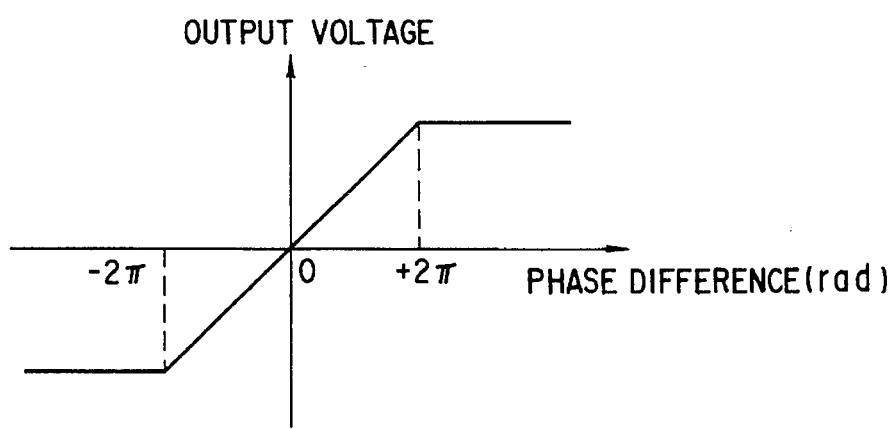
FIG. 3 is a graph showing the phase detection characteristics of the phase/frequency comparator in FIG. 2.

The phase/frequency comparator 17 outputs a pulse-like error signal corresponding to the frequency and phase differences between the two input signals. For example, as shown in FIG. 2, the phase/frequency comparator 17 includes a phase lead detector 17a and a phase lag detector 17b, each of which is constituted by a commercially available monolithic IC, for example SONY CXB1112Q: Phase Frequency Detector With Differential I/O or the like, and a differential amplifier 17c connected to the two detectors 17a and 17b. More specifically, when the phase of a signal from the frequency converter 14 is advanced with respect to the phase of a signal from the voltage-controlled crystal oscillator 11, the phase lead detector 17a detects the phase difference therebetween and outputs a pulse having a width corresponding to the phase difference. When the phase of the signal from the frequency converter 14 is delayed with respect to the phase of the other signal, the phase lag detector 17b detects the phase difference therebetween and outputs a pulse having a width corresponding to the phase difference. The differential amplifier 17c outputs a signal corresponding to the difference between the output from the phase lead detector 17a and the output from the phase lag detector 17b. As shown in FIG. 3, when the phase difference between the two input signals is equal to or larger than a predetermined value (±2π rad), the differential amplifier 17c determines that there is a frequency difference between the two signals, and holds the outputs of the phase detectors 17a and 17b, which respectively correspond to a phase lead or a phase lag, at high level, thereby causing each detector to output a constant DC voltage.

The error signal output from the phase/frequency comparator 17 in this manner is input to a jitter detection filter 18. The jitter detection filter 18 is a low-pass filter. In order to detect variations in the phase of the target signal, the cutoff frequency of the jitter detection filter 18 is set to be lower than the frequency of the output signal from the frequency converter 14 to the phase/frequency comparator 17, and higher (e.g., several 10 MHz) than the frequency (phase variation frequency) of the jitter component of the target signal which is to be measured.

Therefore, the jitter detection filter 18 outputs an output signal which follows variations in the phase of the target signal without any delay, of the signal components contained in the error signal.

The output signal from the jitter detection filter 18 is branched by a second branching circuit 19. One branch output is input as a jitter detection output of the target signal to a display device or indicator (not shown). The other branch output is input to a loop filter 20.

The loop filter 20 is constituted by a low-pass active filter having a cutoff frequency (e.g., several 10 Hz) lower than the frequency of the jitter component of the target signal. The loop filter 20 controls the PLL circuit in such a manner that a DC control voltage obtained by averaging signals passing through the jitter detection filter 18 is input to the voltage-controlled crystal oscillator 11 to cause the frequency and phase of an output signal from the voltage-controlled crystal oscillator 11 to coincide with those of a signal output from the frequency converter 14. In addition, the loop filter 20 keeps the frequency and phase of the output signal from the voltage-controlled crystal oscillator 11 in a fixed state without responding to instantaneous phase variations of the jitter component of the target signal.

When the target signal having the frequency f1 is input to the jitter detection apparatus having the above arrangement, the frequency converter 14 converts the target signal into a signal having the low frequency f1−f3 or f3−f1 by using the output signal from the frequency multiplier 13, and inputs the signal to the phase/frequency comparator 17, together with the output signal from the voltage-controlled crystal oscillator 11.

The phase/frequency comparator 17 then outputs an error signal corresponding to the frequency and phase differences between the two input signals. This error signal is input to the jitter detection filter 18. The signal which has passed through the jitter detection filter 18 is input to the loop filter 20 via the second branching circuit 19. The loop filter 20 outputs a control voltage for causing the frequency and phase of the output signal from the voltage-controlled crystal oscillator 11 to coincide with those of the signal output from the frequency converter 14. With such loop control as a PLL circuit, the output signal from the voltage-controlled crystal oscillator 11 is locked to the output signal from the frequency converter 14.

When phase variations of a frequency higher than the loop band of the PLL circuit occur sinusoidally in the target signal in this locked state, pulse signals whose pulse widths change sinusoidally are output from the phase lead detector 17a and the phase lag detector 17b alternately for every half cycle of the phase variations, as shown in FIGS. 4A and 4B. A difference signal based on the two pulse signals is output from the differential amplifier 17c in the phase/frequency comparator 17, as shown in FIG. 4C.

Subsequently, the jitter detection filter 18, which has received this error signal, outputs a sinusoidal jitter detection signal, like the one shown in FIG. 4D, which is synchronized with the phase variations of the target signal. This jitter detection signal is output to a display device, an indicator, or recorder (none of which are shown) via the second branching circuit 19. In addition, since the frequency of the phase variations is higher than the loop band of the PLL circuit, and the average value of the phase variations is constant, the control voltage from the loop filter 20 undergoes no change, i.e., does not respond to a jitter component, and the frequency and phase of the output signal from the voltage-controlled crystal oscillator 11 are maintained in a fixed state.

If, for example, the frequency f1 of the target signal is set to be higher than the frequency f3, f1−f3=f2, and f3=M·f2. Therefore, the output frequency f2 of the voltage-controlled crystal oscillator 11 is locked to f1/(M+1).

If the frequency f1 of the target signal is set to be lower than the frequency f3, f3−f1=f2. Therefore, the frequency f2 of the voltage-controlled crystal oscillator 11 is locked to f1/(M−1).

That is, theoretically, in this jitter detection apparatus, an output signal from the voltage-controlled crystal oscillator 11 is locked to a frequency obtained by frequency-dividing a target signal by M+1 or M−1.

The allowable change width of the frequency f1 of the target signal can be increased up to (M+1) or (M−1) times the variable width of the frequency f2 of the voltage-controlled crystal oscillator 11.

If, for example, the variable width of the frequency of the voltage-controlled crystal oscillator 11 is ±10 kHz, and M is 12, the change width of the frequency of a target signal increases to ±130 kHz or ±110 kHz. As a result, an allowable change width larger than the variable width of the frequency of the voltage-controlled crystal oscillator can be obtained in spite of the use of the frequency converter.

In addition, theoretically, the above result exhibits M+1 frequency division or M−1 frequency division. In practice, however, since a target signal is converted into a signal having a low frequency by the frequency converter 14, the jitter component contained in the target signal is contained in an output signal from the frequency converter 14, with the modulation degree of the jitter component being maintained. Therefore, the jitter component is output from the jitter detection filter 18 with an output signal from the voltage-controlled crystal oscillator 11 serving as a reference signal. As a result, jitter detection of the target signal in a very high frequency band can be performed with high sensitivity.

In addition, the signal having the frequency f3, which is used for frequency conversion, is obtained by multiplying an output signal from the voltage-controlled crystal oscillator 11, which contains a very small amount of residual jitter. Therefore, the influence of this signal on jitter detection is very small.

Assume that the multiplication degree M is large, and the residual jitter of the corresponding frequency-multiplied output is not negligible. Even in this case, since the residual jitter of the frequency-multiplied output has the same frequency as that of the residual jitter of an output signal from the voltage-controlled crystal oscillator 11, and the corresponding phase-modulated frequency is generally in a normal loop band, loop control is constantly performed to cancel out the residual jitter of the output signal from the voltage-controlled crystal oscillator 11.

Let $\beta_2$ be the modulation degree of phase variations contained in the output signal from the voltage-controlled crystal oscillator 11, and $\omega_{m2}$ be the angular frequency of the output signal. Then, the output signal is given by $$Ed = D \cos\{\omega_2 t + \beta_2 \cos(\omega_{m2} t)\}$$

A signal obtained by frequency-multiplying the output signal by M is given by $$Ee = F \cos\{M\omega_2 t + M\beta_2 \cos(\omega_{m2} t)\}$$

A difference signal component obtained by frequency-dividing the target signal $Ea = A\cos\{\omega_1 t + \beta\cos(\omega_{mt})\}$ by using this frequency-multiplied signal is given by $$Ef = F \cos\{(\omega_1 - M\omega_{m2})t + \beta\cos(\omega_m t) - M\beta_2 \cos(\omega_{m2} t)\}$$

A phase difference $\phi$ between the signal Ef and the output signal Ed from the voltage-controlled crystal oscillator 11 is given by $$\phi = (\omega_1 - M\omega_2 - \omega_2)t - \beta\cos(\omega_m t) - (M+1)\beta_2 \cos(\omega_{m2} t)$$

A voltage $L1(\phi)$ corresponding to this phase difference is applied to the voltage-controlled crystal oscillator 11. The first term $(\omega_1 - M\omega_2 - \omega_2)$ of the above equation is controlled to 0 by PLL loop control with respect to frequency. In addition, the PLL circuit does not respond to jitter component $\beta\cos(\omega_m t)$ of the target signal of the second term. Therefore, after the frequency is locked, loop control of the PLL circuit responds to the third term of the above equation, i.e., $$\phi' = (M+1)\beta_2 \cos(\omega_{m2} t)$$

In this case, if the sensitivity of the voltage-controlled crystal oscillator 11 is represented by K(L) (radian/volt), the PLL loop operates to cancel out the phase variation component $\beta_2 \cos(\omega_{m2} t)$ of the voltage-controlled crystal oscillator 11 according to $L_1(\phi') \cdot K(L)$.

Note that a frequency $\omega_{m2}/2\pi$ of the phase variations of the voltage-controlled crystal oscillator 11 is mainly based on a change in temperature. In general, this frequency is about several Hz and falls within the loop band of the PLL circuit.

Note that a signal output from the jitter detection filter 18 contains a control signal component for suppressing jitter in the voltage-controlled crystal oscillator 11, and the jitter component of a target signal based on a signal whose residual jitter is suppressed by this control signal component. As described above, however, since the frequency of the control signal component is sufficiently lower than that of the jitter component of the target signal, the jitter component of the target signal can be easily separated from the control signal component with a filter or the like. Therefore, accurate jitter detection can be performed without being affected by the residual jitter in the voltage-controlled crystal oscillator 11.

(Another Embodiment)

Figure 5:
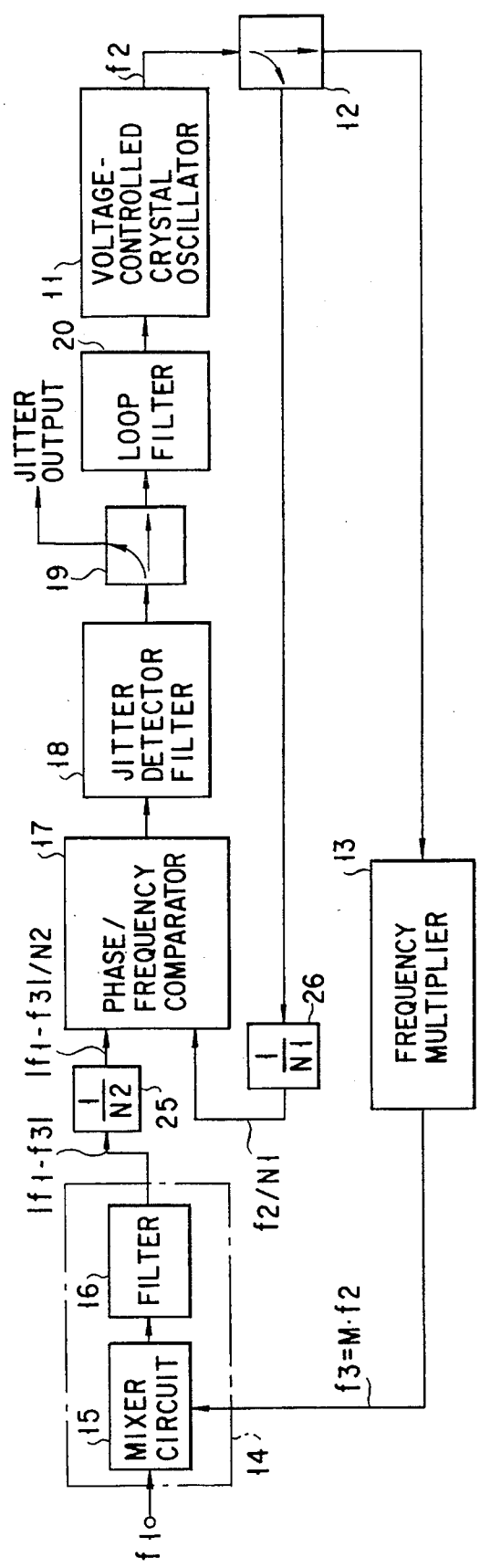
FIG. 5 is a block diagram showing the arrangement of another embodiment of the present invention.

In the embodiment shown in FIG. 1, an output signal from a frequency converter 14 and an output signal from a voltage-controlled crystal oscillator 11 are directly input to a phase/frequency comparator 17. As shown in FIG. 5, however, the two signals may be input to a phase/frequency comparator 17 after the signals are respectively frequency-divided by N2 and N1 using frequency dividers 25 and 26.

With the arrangement shown in FIG. 5, a phase/frequency comparator for a frequency band lower than that in the first embodiment can be used. In addition, if the frequency divider 26 is used in this manner, the modulation degree (corresponding to jitter detection sensitivity) of the phase variations of a frequency-divided output decreases. However, since frequency division is performed after a target signal is frequency-converted by using an output signal from a frequency multiplier, the frequency division can be performed with a lower frequency division ratio than in the case wherein the target signal is directly frequency-divided to have a low frequency. For this reason, no great deterioration in sensitivity occurs, and the jitter detection range broadens corresponding to the frequency division ratio (N2·2π) owing to frequency division, thereby allowing detection of a large amount of jitter. Note that the frequency division ratios (N2 and N1) of the frequency dividers 25 and 26 may be determined in consideration of the modulation degree and jitter amount of phase variations, and N1=N2 need not always be set. For example, frequency division ratio (N1) of the frequency divider 26 may be set to be 1, i.e., an output from the voltage-controlled crystal oscillator 11 may be directly input to the phase/frequency comparator 17 to frequency-divide only an output from the frequency converter 14 by N2 (e.g., 4) using the frequency divider 25. The following are numerical values set in the arrangement shown in FIG. 5:

f1=2488.32 MHz, f2=155.52 MHz, f3=1866.24 MHz (=M·f2)

f1−f3=622.08 MHz,

N2=4,

N1=1, (f1−f3)/N2=155.52 MHz

M=12

FIG. 6 shows a practical arrangement of a frequency multiplier 13 for realizing M=12.

In this frequency multiplier 13, a comparator/frequency multiplier 13a and a first band-pass filter (to be referred to as a BPF hereinafter) 13b are used to set 3f2; a first doubler 13c and a second BPF 13d are used to set 6f2; and a second doubler 13e and a third BPF 13f are used to set 12f2. With this arrangement, as described above, a 12 frequency multiplier exhibiting little phase fluctuations of an input/output signal can be realized.

Assume that the frequency characteristics of the respective BPFs are set to have frequency bands allowing selection of signals having frequencies 3f2, 6f2, and 12f2.

FIGS. 7A and 7B respectively show a practical arrangement of the comparator/frequency multiplier 13a for realizing 3 frequency multiplication, and the operation principle of the comparator/frequency multiplier.

In this comparator/frequency multiplier 13a, an input signal $f_{IN}$ is sliced by two comparators 13a1 and 13a2 having different reference voltages $v_{t(1)}$ and $v_{t(2)}$ and the resultant signal components are added by an adder 13a3, thereby outputting an output signal $f_{OUT}$ having a frequency $3f_{IN}$.

In the embodiments shown in FIGS. 1 and 5, one phase/frequency comparator 17 is used to detect jitter and an error signal for loop control. However, as shown in FIG. 8, a phase comparator 17a may be used to detect jitter, whereas a phase/frequency comparator 17b may be used for loop control as a PLL circuit. In this case, a second branching circuit 19 need not be used.

Furthermore, in the embodiments shown in FIGS. 1 and 5, an error signal output from the phase/frequency comparator 17 is input to the loop filter 20 via the jitter detection filter 18. As shown in FIG. 9, however, an output from the voltage-controlled crystal oscillator 11 may be branched by the second branching circuit 19, and the two branch outputs may be supplied parallelly such that one output is input to the jitter detection filter 18 and the other output is input to the loop filter 20.

As has been described above, the jitter detection apparatus of the present invention uses a double-PLL structure, in which a target signal is frequency-converted (first PLL) to have a low frequency by using a signal obtained by frequency-multiplying an output signal from the voltage-controlled crystal oscillator in the PLL circuit by M, and loop control (second PLL) is performed to lock the phase of the output signal from the voltage-controlled crystal oscillator to the phase of the converted output, thereby detecting a jitter component contained in the target signal from an error signal based on the two signals.

Even if, therefore, a target signal having a high frequency undergoes great frequency variations, stable jitter measurement can be performed in spite of the use of frequency conversion using the mixer. In addition, a target signal is frequency-mixed with a signal obtained by frequency-multiplying the frequency of the voltage-controlled crystal oscillator by M so as to decrease the frequency of the target signal. Therefore, a jitter component contained in a target signal can be accurately measured with a simple arrangement.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A jitter detection apparatus comprising:

a voltage-controlled crystal oscillator;

a frequency multiplier for receiving an output signal from said voltage-controlled crystal oscillator, multiplying a frequency of the output signal, and outputting a resultant signal;

a frequency converter for frequency-mixing a target signal as a jitter detection target and the output signal from said frequency multiplier, and outputting a signal having a frequency corresponding to a frequency difference between the two signals;

a comparator for outputting an error signal corresponding to a phase difference between the output signal from said frequency converter and the output signal from said voltage-controlled crystal oscillator;

a loop filter for controlling a phase of the output signal from said voltage-controlled crystal oscillator by using the error signal output from said comparator; and a low-pass jitter detection filter for filtering the error signal from said comparator and outputting a jitter component of the target signal, said loop filter having low-pass frequency characteristics based on a cutoff frequency lower than a frequency of the jitter component contained in the target signal.

2. An apparatus according to claim 1, wherein the frequency of the output signal from said voltage-controlled crystal oscillator is set to be near $1/(M\pm1)$ (where M is an integer not less than two) the frequency of the target signal.

3. An apparatus according to claim 1, wherein said jitter detection filter has low-pass frequency characteristics based on a cutoff frequency lower than the frequency of the output signal output from said frequency converter to said comparator and higher than a frequency of the jitter component contained in the target signal.

4. An apparatus according to claim 1, wherein said frequency multiplier includes an M frequency multiplier (M is an integer not less than two).

5. An apparatus according to claim 1, wherein said comparator comprises:

a phase comparator for comparing phases of the output signals from said frequency converter and said voltage-controlled crystal oscillator and supplying a phase comparison output signal to said jitter detection filter; and a phase/frequency comparator for comparing phases and frequencies of the output signals from said frequency converter and said voltage-controlled crystal oscillator, and supplying a phase/frequency comparison output signal to said loop filter.

6. An apparatus according to claim 1, wherein said comparator comprises a phase/frequency comparator for comparing phases and frequencies of the output signals from said frequency converter and said voltage-controlled crystal oscillator, and parallelly supplying a phase/frequency comparison output signal to said jitter detection filter and said loop filter.

7. A jitter detection apparatus for detecting a jitter component contained in a target signal having a first frequency f1, comprising:

a voltage-controlled crystal oscillator for outputting an output signal having a second frequency f2;

a first branching circuit for branching the output signal from said voltage-controlled crystal oscillator;

a frequency multiplier for multiplying the frequency f2 of one signal, branched by said first branching circuit, by M to obtain and output an output signal having a third frequency f3 (=M·f2);

a mixer circuit for mixing the target signal with the output signal from said frequency multiplier;

filter means for outputting an output signal which has a frequency component, corresponding to a difference f1–f3 between the first and third frequencies, of output signal components from said mixer circuit;

phase/frequency comparison means for receiving the output signal from said filter means and the other signal branched by said branching circuit, comparing frequencies and phases of the signals, and outputting an error signal;

a jitter detection filter for detecting a jitter component contained in the target signal by filtering the error signal output from said phase/frequency comparison means with predetermined frequency characteristics;

a second branching circuit for branching the output signal from said jitter detection filter into first and second signals, and outputting the first signal as a jitter component contained in the target signal; and a loop filter for outputting a control signal for controlling a phase of the output signal from said voltage-controlled crystal oscillator by filtering the second signal branched by said second branching circuit with predetermined frequency characteristics.

8. An apparatus according to claim 7, wherein the second frequency f2 of the output signal from said voltage-controlled crystal oscillator is set to be near $1/(M\pm1)$ (where M is an integer not less than two) the first frequency f1 of the target signal.

9. An apparatus according to claim 7, wherein said jitter detection filter has low-pass frequency characteristics based on a cutoff frequency lower than the third frequency f3 of the output signal output from said filter means to said frequency/phase comparison means and higher than a frequency of the jitter component contained in the target signal.

10. An apparatus according to claim 7, wherein said loop filter has low-pass frequency characteristics based on a cutoff frequency lower than a frequency of the jitter component contained in the target signal.

11. An apparatus according to claim 7, wherein said frequency multiplier includes an M frequency multiplier (M is an integer not less than two).

12. An apparatus according to claim 7, wherein said phase/frequency comparison means comprises:

a phase comparator for comparing phases of the output signals from said filter means and said voltage-controlled crystal oscillator and supplying a phase comparison output signal to said jitter detection filter; and a phase/frequency comparator for comparing phases and frequencies of the output signals from said filter means and said voltage-controlled crystal oscillator, and supplying a phase/frequency comparison output signal to said loop filter.

13. An apparatus according to claim 7, wherein said phase/frequency comparison means comprises a phase/frequency comparator for comparing phases and frequencies of the output signals from said filter means and said voltage-controlled crystal oscillator, and parallelly supplying a phase/frequency comparison output signal to said jitter detection filter and said loop filter via said second branching circuit.

14. A jitter detection apparatus for detecting a jitter component contained in a target signal having a first frequency f1, comprising:

a voltage-controlled crystal oscillator for outputting an output signal having a second frequency f2;

a first branching circuit for branching the output signal from said voltage-controlled crystal oscillator;

a frequency multiplier for multiplying the frequency f2 of one signal, branched by said first branching circuit, by M to obtain and output an output signal having a third frequency f3 $(=M\cdot f2)$;

a mixer circuit for mixing the target signal with the output signal from said frequency multiplier;

filter means for outputting an output signal which has a frequency component, corresponding to a difference |f1–f3| between the first and third frequencies, of output signal components from said mixer circuit;

a first frequency divider for dividing by N1 the frequency f2 of the other signal branched by said first branching circuit;

a second frequency divider for frequency-dividing the output signal output from said filter means having a frequency component |f1–f3|;

phase/frequency comparison means for receiving the output signals frequency-divided by said first and second frequency dividers and comparing frequencies and phases of the output signals to output an error signal;

a jitter detection filter for detecting a jitter component contained in the target signal by filtering the error signal output from said phase/frequency comparison means with predetermined frequency characteristics;

a second branching circuit for branching the output signal from said jitter detection filter into first and second signals, and outputting the first signal as a jitter component contained in the target signal; and a loop filter for outputting a control signal for controlling a phase of the output signal from said voltage-controlled crystal oscillator by filtering the second signal branched by said second branching circuit with predetermined frequency characteristics.

15. An apparatus according to claim 14, wherein the second frequency f2 of the output signal from said voltage-controlled crystal oscillator is set to be near $1/(M\pm1)$ (where M is an integer not less than two) the first frequency f1 of the target signal.

16. An apparatus according to claim 14, wherein said jitter detection filter has low-pass frequency characteristics based on a cutoff frequency lower than a third frequency f3/N of the output signal output from said filter means to said frequency/phase comparison means and higher than a frequency of the jitter component contained in the target signal.

17. An apparatus according to claim 14, wherein said loop filter has low-pass frequency characteristics based on a cutoff frequency lower than a frequency of the jitter component contained in the target signal.

18. An apparatus according to claim 14, wherein said frequency multiplier includes an M frequency multiplier (M is an integer not less than two).

19. An apparatus according to claim 14, wherein said phase/frequency comparison means comprises:

a phase comparator for comparing phases of the output signals from said second frequency divider and said first frequency divider and supplying a phase comparison output signal to said jitter detection filter; and a phase/frequency comparator for comparing phases and frequencies of the output signals from said second frequency divider and said first frequency divider, and supplying a phase/frequency comparison output signal to said loop filter.

20. An apparatus according to claim 14, wherein said phase/frequency comparison means comprises a phase/frequency comparator for comparing phases and frequencies of the output signals from said second frequency divider and said first frequency divider, and parallelly supplying a phase/frequency comparison output signal to said jitter detection filter and said loop filter via said second branching circuit.

21. A jitter detection apparatus comprising:

a voltage-controlled crystal oscillator;

a frequency multiplier for receiving an output signal from said voltage-controlled crystal oscillator, multiplying a frequency of the output signal, and outputting a resultant signal;

a frequency converter for frequency-mixing a target signal as a jitter detection target and the resultant signal from said frequency multiplier, and outputting a signal having a frequency corresponding to a frequency difference between the two signals;

a phase/frequency comparator for outputting an error signal corresponding to a phase difference between the output signal from said frequency converter and the output signal from said voltage-controlled crystal oscillator;

a loop filter for controlling a phase of the output signal from said voltage-controlled crystal oscillator by using the error signal output from said comparator; and a low-pass jitter detection filter for filtering the error signal from said comparator and outputting a jitter component of the target signal, said jitter detection filter having low-pass frequency characteristics based on a cutoff frequency lower than the frequency of the output signal output from said frequency converter to said phase/frequency comparator and higher than a frequency of the jitter component contained in the target signal.

22. An apparatus according to claim 21, wherein the frequency of the output signal from said voltage-controlled crystal oscillator is set to be near $1/(M\pm1)$ (where M is an integer not less than two) the frequency of the target signal.

23. An apparatus according to claim 21, wherein said loop filter has low-pass frequency characteristics based on a cutoff frequency lower than a frequency of the jitter component contained in the target signal.

24. An apparatus according to claim 21, wherein said frequency multiplier includes an M frequency multiplier (M is an integer not less than two).

25. An apparatus according to claim 21, wherein said comparator comprises:

a phase comparator for comparing phases of the output signals from said frequency converter and said voltage-controlled crystal oscillator and supplying a phase comparison output signal to said jitter detection filter; and a phase/frequency comparator for comparing phases and frequencies of the output signals from said frequency converter and said voltage-controlled crystal oscillator, and supplying a phase/frequency comparison output signal to said loop filter.

26. An apparatus according to claim 21, wherein said comparator comprises a phase/frequency comparator for comparing phases and frequencies of the output signals from said frequency converter and said voltage-controlled crystal oscillator, and parallelly supplying a phase/frequency comparison output signal to said jitter detection filter and said loop filter.

* * * * *